(12) United States Patent
Phillips et al.

(10) Patent No.: US 11,244,412 B1
(45) Date of Patent: Feb. 8, 2022

(54) INTERFACE FOR UNCOMPLETED HOMES PLANNING

(71) Applicant: Zillow, Inc., Seattle, WA (US)

(72) Inventors: Richard Phillips, Oakland, CA (US); Alexandria Phillips, Oakland, CA (US)

(73) Assignee: Zillow, Inc., Seattle, WA (US)

( * ) Notice: Subject to any disclaimer, the term of this patent is extended or adjusted under 35 U.S.C. 154(b) by 373 days.

(21) Appl. No.: 15/949,792

(22) Filed: Apr. 10, 2018

Related U.S. Application Data

(60) Provisional application No. 62/505,765, filed on May 12, 2017.

(51) Int. Cl.
*G06Q 30/00* (2012.01)
*G06Q 50/16* (2012.01)
*G06Q 30/06* (2012.01)
*G06F 30/13* (2020.01)

(52) U.S. Cl.
CPC .......... *G06Q 50/165* (2013.01); *G06F 30/13* (2020.01); *G06Q 30/0621* (2013.01); *G06Q 30/0641* (2013.01)

(58) Field of Classification Search
CPC .................................................. G06Q 30/00
See application file for complete search history.

(56) References Cited

U.S. PATENT DOCUMENTS

| | | | | |
|---|---|---|---|---|
| 5,754,850 A * | 5/1998 | Janssen | ............... | G06Q 30/0601 707/758 |
| 7,076,455 B1 * | 7/2006 | Fogelson | ............ | G06Q 30/0277 705/14.73 |
| 7,236,985 B2 * | 6/2007 | Brecher | ................. | G06Q 30/06 707/736 |
| 7,353,192 B1 * | 4/2008 | Ellis | .................... | G06Q 20/3829 705/26.5 |
| 8,510,031 B2 * | 8/2013 | Williams | ............... | G06Q 40/12 701/400 |
| 10,430,902 B1 * | 10/2019 | Rawat | ................. | G06F 16/5866 |
| 10,521,943 B1 | 12/2019 | Phillips | | |
| 10,664,781 B2 * | 5/2020 | Pettersson | ........ | G06Q 10/06313 |
| 2002/0065739 A1 * | 5/2002 | Florance | ............ | G06Q 30/0617 705/26.43 |
| 2003/0052896 A1 | 3/2003 | Higgins | | |
| 2005/0114107 A1 | 5/2005 | Putnam et al. | | |
| 2005/0234813 A1 * | 10/2005 | West | ...................... | G06Q 20/10 705/37 |
| 2006/0271474 A1 * | 11/2006 | Patterson | ............... | G06Q 20/10 705/39 |

(Continued)

FOREIGN PATENT DOCUMENTS

WO WO-2008153978 A2 * 12/2008 ............. G06Q 50/16

OTHER PUBLICATIONS

Buildersupdate1, My Florida Regional MLS chooses Builders Update, media@buildersupdate.com, dated Jul. 8, 2014. (Year: 2014).*

(Continued)

*Primary Examiner* — Mark A Fadok
(74) *Attorney, Agent, or Firm* — Perkins Coie LLP

(57) ABSTRACT

A variety of improved techniques for homebuyers to access undeveloped and/or uncompleted communities with homes that are not yet built and lots that are not yet parceled or recognized with addresses are disclosed.

20 Claims, 14 Drawing Sheets

(56) References Cited

U.S. PATENT DOCUMENTS

| | | | |
|---|---|---|---|
| 2008/0052196 A1* | 2/2008 | Fino | G06Q 30/06 705/26.1 |
| 2008/0147311 A1* | 6/2008 | Zoller | G09B 29/007 701/533 |
| 2008/0204462 A1* | 8/2008 | Reed | G01C 21/3614 345/520 |
| 2008/0222402 A1* | 9/2008 | Connors | G06Q 30/0629 713/1 |
| 2009/0254436 A1* | 10/2009 | Dagum | G06Q 30/02 705/14.48 |
| 2011/0125393 A1* | 5/2011 | Williams | G06Q 30/0256 701/532 |
| 2011/0276534 A1* | 11/2011 | Ubalde | G06F 16/29 707/600 |
| 2013/0211963 A1* | 8/2013 | Williams | G06Q 30/04 705/26.43 |
| 2013/0222373 A1* | 8/2013 | Weinstein | G06F 16/248 345/419 |
| 2013/0339150 A1* | 12/2013 | Williams | G06Q 30/0273 705/14.54 |
| 2014/0316837 A1* | 10/2014 | Fosburgh | G06Q 50/08 705/7.22 |
| 2015/0186953 A1* | 7/2015 | Gross | G06T 1/0007 705/14.58 |
| 2015/0324940 A1* | 11/2015 | Samson | G06Q 10/08 705/7.23 |
| 2016/0092959 A1* | 3/2016 | Gross | G06Q 30/0276 705/26.62 |
| 2016/0141869 A1* | 5/2016 | Byron | H02J 3/00 700/291 |
| 2016/0171011 A1* | 6/2016 | Drogobetski | G06F 3/04842 707/722 |
| 2017/0039765 A1 | 2/2017 | Zhou et al. | |
| 2017/0084037 A1 | 3/2017 | Hernandez et al. | |
| 2017/0359695 A1* | 12/2017 | Aerts | H04W 64/00 |

OTHER PUBLICATIONS

Buildersupdate2, webarchive.org/web/2015031810004/https//www.buildersupdate.com/home buyer portal.aspx, dated Mar. 18, 2015 (Year: 2015).*

Buildersupdate3, Video snapshot 1 snaged from youtube video, Builders update makes life easy for realestate agents and builders, dated Mar. 15, 2015. (Year: 2015).*

Buildersupdate4 Video snapshot 2 snaged from youtube video, Builders update makes life easy for realestate agents and builders, dated Mar. 15, 2015. (Year: 2015).*

Pelletier Realty Group, web.archive.org/web/20161021162500/http://www.pelliertiergroup.com, dated Oct. 21, 2016. (Year: 2016).*

U.S. Appl. No. 15/788,488, of Phillips, R., filed Oct. 19, 2017.

Non-Final Office Action in U.S. Appl. No. 15/788,488, dated Nov. 20, 2018; 30 pages.

Notice of Allowance in U.S. Appl. No. 15/788,488; dated Oct. 17, 2019; 10 pages.

Final Office Action in U.S. Appl. No. 15/788,488; dated May 17, 2019; 43 pages.

* cited by examiner

| | Price | # Bedrooms | # Bathrooms | Home Size | Lot Size | Walk Score | School Ranking |
|---|---|---|---|---|---|---|---|
| 1205a Community Name 1, By Builder 1 | $300 – 500 k | 3 – 4 bd | 1.5 – 2.5 ba | 1,245 – 2,832 sq ft | 8000 – 10,000 sq ft | 50 | Elem – 6, Middle – 7, High – 7 |
| 1205b Community Name 2, By Builder 2 | $350 – 500 k | 3 – 4 bd | 1.5 – 2.5 ba | 1,300 – 2,800 sq ft | 8,500 – 10,200 sq ft | 65 | Elem – 7, Middle – 8, High – 7 |
| 1205c Community Name 4, By Builder 3 | $450 – 625 k | 5 – 7 bd | 3.5 – 5 ba | 3,245-4,832 sq ft | 10,000 – 11,250 sq ft | 60 | Elem – 8, Middle – 8, High – 9 |

Sort By: Beds, Baths, Price

Add attributes | Add properties

FIG. 12

INTERFACE FOR UNCOMPLETED HOMES PLANNING

CROSS-REFERENCE TO RELATED APPLICATION(S)

This application claims the benefit of U.S. Provisional Patent Application No. 62/505,765, filed on May 12, 2017 and entitled "INTERFACE FOR NEW CONSTRUCTION PLANNING," which is incorporated herein by reference in its entirety. This application is also related to U.S. patent application Ser. No. 15/788,488, filed on Oct. 19, 2017, and entitled "METHOD, SYSTEM AND APPARATUS FOR LOT PLANNING," which claims the benefit of U.S. Provisional Patent Application No. 62/411,071, filed on Oct. 21, 2016, and entitled "METHOD, SYSTEM AND APPARATUS FOR LOT PLANNING," each of which is incorporated herein by reference in its entirety.

BACKGROUND

Builders often purchase large parcels of land and divide those into lots to create a community. The lots often have no geographical location identifier; and therefore developers face difficulties exporting accurate geographical location identifiers to mapping and property inventorying. Builders further have difficulty providing consumable information to buyers.

BRIEF DESCRIPTION OF THE DRAWINGS

FIG. 8 illustrates a sample user interface for viewing available floor-plans and amenities for selected uncompleted home lots.

FIG. 11 illustrates a sample user interface presented by the facility in some embodiments to enable a user to view statistics of uncompleted homes communities.

FIG. 12 illustrates a sample user interface presented by the facility in some embodiments to enable a user to compare two or more homes/communities.

DETAILED DESCRIPTION

Figure 1:
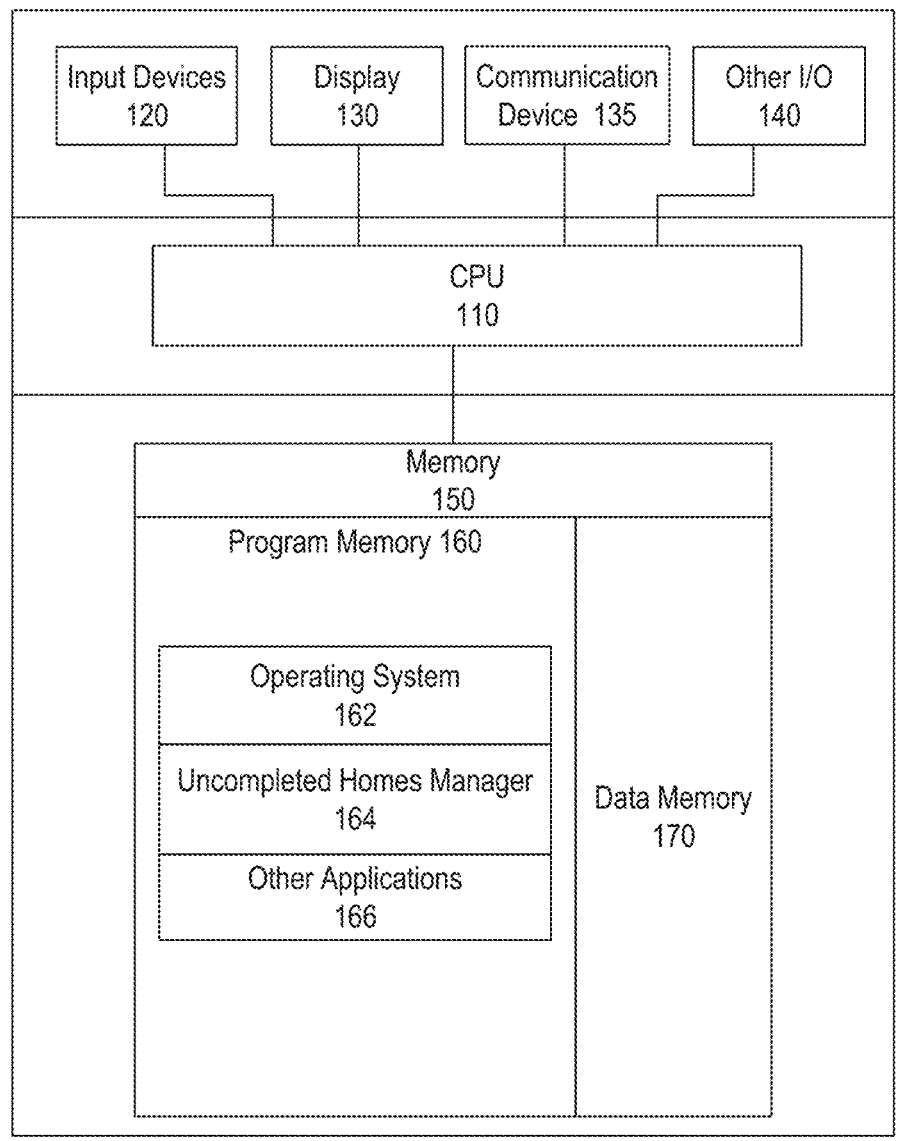
FIG. 1 is a block diagram showing some of the components typically incorporated in computer systems and other devices on which the facility operates.

Prospective home buyers generally spend significant amounts of time and money on property-listing sites to search for and identify properties of interest. These property-listing sites provide information about completed real-estate properties that have already been built, reflecting prior decisions about lot location, floor-plan, and amenities options. However, it is difficult for prospective buyers to identify and view information about real-estate properties that do not yet exist (e.g., at a time before land has been subdivided into separate lots and houses built on them). For example, a builder who is planning a new real-estate community, typically develops lot plans and/or maps for a community. A typical lot plan marks the location and boundaries of each lot in the community, as well as other notable locations, such as, community center(s), play area(s), recreation area(s), trails (e.g., walking trails, biking trails, etc.), etc. Conventional property-listing sites do not enable a prospective buyer to identify and locate information about these intended lots in a real-estate development community that is in a pre-construction and/or an under-construction stage. Instead, the prospective buyer has to typically rely on traditional means (e.g., advertisements, word-of-mouth, etc.) to identify uncompleted homes communities. This is both inefficient and time-consuming, as the buyer has to first identify each uncompleted homes community and then contact each community separately to gather information about lots, floor-plans, and amenities available in each uncompleted homes community. The prospective buyer is also unable to simultaneously search for or compare uncompleted homes in multiple communities based on preferred search criteria (e.g., location, size of home, number of bedrooms, number of bathrooms, available amenities, etc.). Also, the prospective buyer often does not receive information about all available uncompleted homes communities and can miss out on valuable opportunities for buying real-estate.

Moreover, even when a prospective buyer identifies one or more uncompleted homes communities, he/she has to typically visit a physical office of each builder (or management company) in charge of the uncompleted homes community in order to view available lot locations, floor-plans, and amenities, and select suitable options. And, after initial selection, the buyer is unable to view and/or edit selected options. For example, once a buyer selects a lot location, a floor-plan, and/or one or more amenities at the builder location, based on the stage of the construction, the buyer is unable to view and/or edit lot locations (e.g., a lot location on a different street or with a different orientation), floor-plans (e.g., floor-plans with different configurations of rooms, number of bedrooms, number of bathrooms, sizes of rooms, etc.) and/or amenities (e.g., flooring, windows, bathroom fixtures, tiles, counters, cabinets, extensions, appliances, etc.).

In view of the shortcomings of conventional approaches to connecting prospective buyers and builders of uncomplete home communities, the inventors have recognized that a new approach to uncompleted homes listings that is more universally accessible, less expensive, and more convenient would have significant utility.

A software, hardware, and/or firmware facility ("the facility") that provides a unified solution for searching for uncompleted homes and/or selecting/editing associated floor-plans and amenities is described. Uncompleted homes include real-estate properties that have not yet been constructed—for example, properties that are currently in various planning stages (e.g., country approval received for developing a parcel of land) or construction stages (e.g., not constructed, partially constructed, etc.). In several embodiments, the facility allows a builder to upload community maps/plans and reference map(s) associated with geographic areas (e.g., parcels of land). The facility then constructs a combined view that is an accurate representation of the lot map's placement on a parcel of land. Applicants' co-pending U.S. patent application Ser. No. 15/788,488 provides more detail about constructing a combined view for lot planning. Once the facility constructs a combined view of a parcel of land, it enables a builder to associate the combined view with a community or a project. The facility also enables the builder to add/edit one or more attributes, such as community name, builder name, location, contact information, features, reviews received, awards received, school information, etc. The facility further enables the builder to upload one or more floor-plans and/or amenities for the community as well as associate floor-plan and/or amenities information with the lots in the constructed combined view to make these available to prospective buyers.

In several embodiments, the facility enables prospective buyers to search for uncompleted homes available for sale. The facility receives search criteria from a prospective buyer (e.g., location, size of home, number of bedrooms, number of bathrooms, available amenities, etc.). The facility searches for uncompleted homes matching the search criteria and displays the results at a user interface. For example, if a prospective buyer specifies search criteria for all uncompleted homes in Seattle, Wash. with at least four bedrooms and 1000 sq. ft. or more in size, the facility searches for matching real-estate properties in a data storage repository that stores information of uncompleted homes uploaded by one or more builders. These uncompleted homes are typically homes that have not yet been constructed. The facility displays lot information of matching uncompleted homes such as those offered for sale by multiple different builders) to the prospective buyer. The facility receives a selection of one or more displayed lots from the prospective buyer. The facility then displays lot information, floor-plan information, and/or amenities information for the selected lots. The facility receives a selection of one or more lots and associated floor-plan and/or amenities information. In several embodiments, the facility displays information about multiple selected lots (and/or associated floor-plans and amenities) in a manner that the prospective buyer can efficiently and easily compare multiple selections (including, for example, key features, cost, delivery date(s), etc.). The prospective buyer can mark one or more selections (lots, floor-plans, amenities, etc.) as favorites, which can be later retrieved for viewing and/or editing.

In several embodiments, the facility enables builders to make one or more floor-plans available for all (or a selection) of lots in a community, making these lots eligible for inclusion in the search results based on one or more query attributes. For example, a builder can make a 2000 sq. ft. floor-plan available to all the lots in a community such that when a prospective buyer searches for homes with a size greater than 1800 sq. ft., all of the available lots are displayed in the search results.

In several embodiments, the facility receives identification information from a user (e.g., builder, prospective buyer, etc.) and displays information about one or more communities, lots, floor-plans, and/or amenities associated with the authenticated user. For example, the facility receives identification information from a prospective buyer and displays information about a selected lot on which the buyer's home is being built. The facility displays the selected floor-plans and/or amenities and enables the buyer to add and/or update the selections. In several embodiments, the facility enables the buyer to edit the selections depending on a stage of the lot construction project. For example, the facility allows the buyer to edit a selected floor-plan for a lot only until 45 days from signing a buyer's contract with the builder. After 45 days, the facility prevents the buyer from making any changes to the selected floor-plan. As another example, the facility allows the buyer to select or edit a selected flooring amenities option (e.g., carpet, hardwood, tiles, etc.) until a framing of the house is completed. So up until the framing of the house is complete, the buyer can update the flooring amenities options for a selected lot.

By performing in some or all of the manners discussed below, the facility can help buyers search for, select, customize, and compare not just completed homes, but also uncompleted homes. The facility provides a universally accessible, less expensive, and more convenient solution. For example, a prospective buyer can use the facility to search for and access information about uncompleted homes offered by multiple builders and/or in several different communities in a centralized and easily accessible manner. This results in optimization of the computing and telecommunication resources of both the buyer and the builder. For example, the facility reduces the utilization of a buyer's computing resources because the buyer does not have to access websites of each buyer and each community to retrieve information and then filter it manually based on preferences. As another example, the facility reduces the utilization of a buyer's telecommunication resources because the buyer does not have to contact each builder to inquire about and gather information. The facility similarly reduces the utilization of a builder's computing and/or telecommunication resources because the builder need not respond to every buyer request—instead, the facility filters the buyers' requests based on search criteria specified by the buyer and only forwards a subset of buyer requests based on the filter criteria.

DESCRIPTION OF FIGURES

The following description provides certain specific details of the illustrated examples. One skilled in the relevant art will understand, however, that embodiments can be practiced without many of these details. Likewise, one skilled in the relevant art will also understand that the present disclosure can include many other features not described in detail herein. Additionally, some well-known structures or functions may not be shown or described in detail below, to avoid unnecessarily obscuring the relevant descriptions of the various examples.

Several implementations are discussed below in more detail in reference to the figures. Turning now to the figures, FIG. 1 is a block diagram showing some of the components typically incorporated in computer systems and other devices on which the facility operates. Device 100 can include one or more input devices 120 that provide input to the CPU(s) (processor) 110, notifying it of actions. The actions can be mediated by a hardware controller that interprets the signals received from the input device and communicates the information to the CPU 110 using a communication protocol. Input devices 120 include, for example, a mouse, a keyboard, a touchscreen, an infrared sensor, a touchpad, a wearable input device, a camera or image-based input device, a microphone, or other user input devices.

In various embodiments, the CPU 110 is a single processing unit or multiple processing units in a device or distributed across multiple devices. The CPU 110 is coupled to other hardware devices, for example, with the use of a bus, such as a PCI bus or SCSI bus. The CPU 110 communicates with a hardware controller for devices, such as for a display 130. The display 130 is used to display text and graphics. For example, display 130 provides graphical and textual visual feedback to a user. Display 130 can include the input device as part of the display, such as when the input device is a touchscreen or is equipped with an eye direction monitoring system. In some implementations, the display is separate from the input device. Examples of display devices are: an LCD display screen, an LED display screen, a projected, holographic, or augmented reality display (such as a heads-up display device or a head-mounted device), and so on. Other I/O devices 140 can also be coupled to the processor, such as a network card, video card, audio card, USB, firewire or other external device, camera, printer, speakers, CD-ROM drive, DVD drive, disk drive, or Blu-Ray device.

In some embodiments, the device 100 includes a communication device 135 capable of communicating with a network node. The communication device communicates with another device or a server through a network using, for example, TCP/IP protocols. The device 100 can utilize the communication device 135 to distribute operations across multiple network devices to send and/or receive data, such as via the Internet or another network and its networking hardware, such as switches, routers, repeaters, electrical cables and optical fibers, light emitters and receivers, radio transmitters and receivers, and the like.

The CPU 110 can have access to a memory 150 in a device or distributed across multiple devices. The memory 150 includes one or more of various hardware devices for volatile and non-volatile storage, and can include both read-only and writable memory. For example, the memory 150 comprises random access memory (RAM), CPU registers, read-only memory (ROM), and writable non-volatile memory, such as flash memory, hard drives, floppy disks, CDs, DVDs, magnetic storage devices, tape drives, device buffers, and so forth. The memory 150 is not a propagating signal divorced from underlying hardware; a memory is thus non-transitory. The memory 150 can include program memory 160 that stores programs and software, such as an operating system 162, uncompleted homes manager 164, and other application programs 166. Memory 150 can also include data memory 170 that includes user data (e.g., user identifiers, user profiles, etc.), builder data (e.g., builder identifier, builder name, builder affiliates, builder location, builder rating, builder reviews, etc.), lot information data (e.g., lot identifiers, lot locations, available plans, etc.), floor-plan information (e.g., plan identifiers, builders, plan details, etc.), amenities information (e.g., amenity identifiers, amenity details, etc.), etc., which is provided to the program memory 160 or any element of the device 100.

In various embodiments, the facility operates within numerous other general purpose or special purpose computing system environments or configurations. Examples of well-known computing systems, environments, and/or configurations that may be suitable for use with the technology include, but are not limited to, personal computers, server computers, handheld or laptop devices, cellular telephones, wearable electronics, gaming consoles, tablet devices, multiprocessor systems, microprocessor-based systems, set-top boxes, programmable consumer electronics, network PCs, minicomputers, mainframe computers, distributed computing environments that include any of the above systems or devices, or the like.

Figure 2:
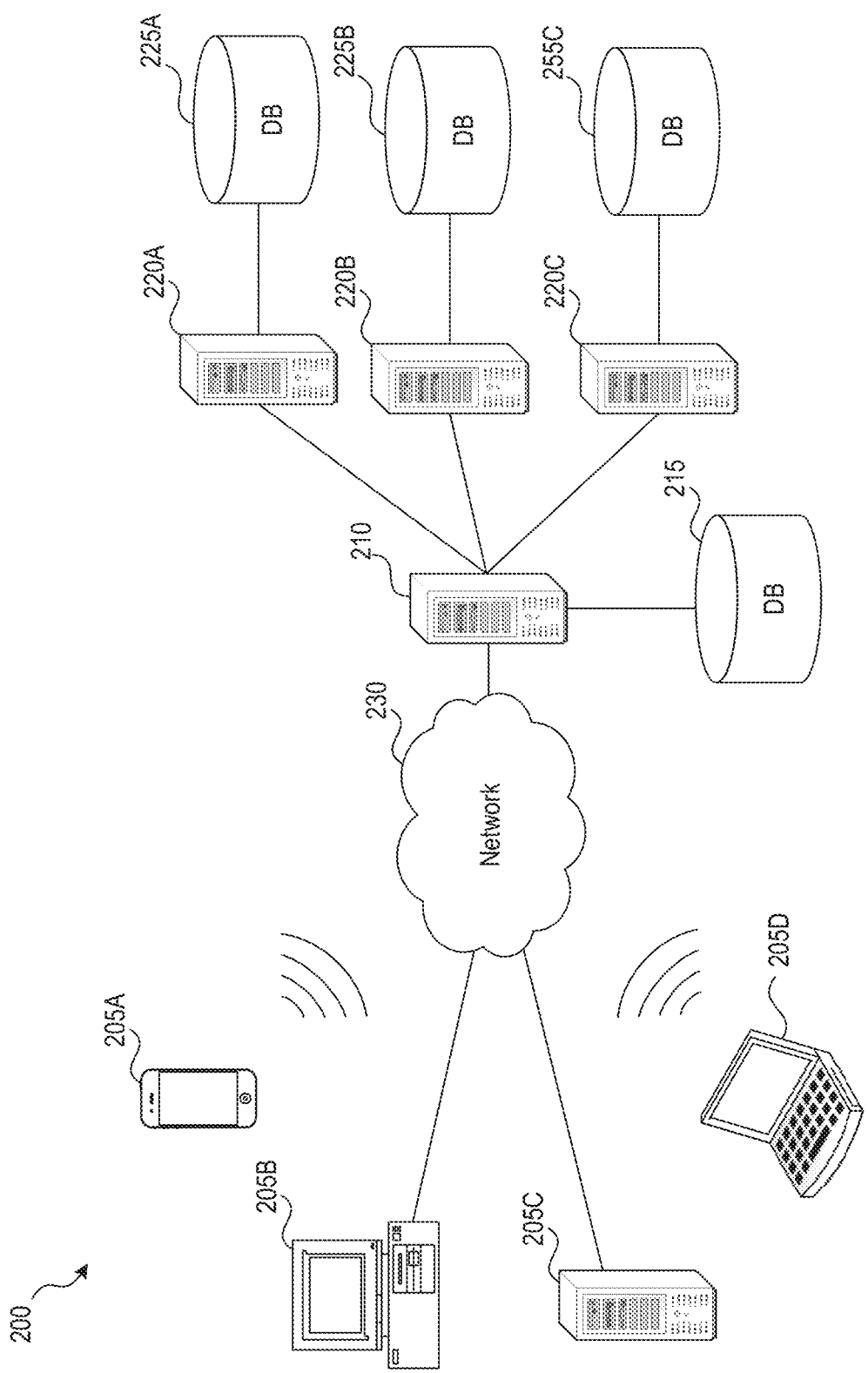
FIG. 2 is a system diagram illustrating an example of a computing environment in which the facility is utilized in some embodiments.

FIG. 2 is a system diagram illustrating an example of a computing environment in which the facility is utilized in some embodiments. In some implementations, environment 200 includes one or more client computing devices 205A-D, examples of which can include device 100. Client computing devices 205 operate in a networked environment using logical connections 210 through network 230 to one or more remote computers, such as a server computing device.

In some implementations, server 210 is an edge server which receives client requests and coordinates fulfillment of those requests through other servers, such as servers 220A-C. In some implementations, server computing devices 210 and 220 comprise computing systems, such as device 100. Though each server computing device 210 and 220 is displayed logically as a single server, server computing devices can each be a distributed computing environment encompassing multiple computing devices located at the same or at geographically disparate physical locations. In some implementations, each server 220 corresponds to a group of servers.

Client computing devices 205 and server computing devices 210 and 220 can each act as a server or client to other server/client devices. In some implementations, servers (210, 220A-C) connect to a corresponding database (215, 225A-C). As discussed above, each server 220 can correspond to a group of servers, and each of these servers can share a database or can have their own database. Databases 215 and 225 warehouse (e.g., store) information such as user data (e.g., user identifiers, user profiles, etc.), builder data (e.g., builder identifier, builder name, builder affiliates, builder location, builder rating, builder reviews, etc.), lot information data (e.g., lot identifiers, lot locations, available plans, etc.), floor-plan information (e.g., plan identifiers, builders, plan details, etc.), amenities information (e.g., amenity identifiers, amenity details, etc.), etc. Though databases 215 and 225 are displayed logically as single units, databases 215 and 225 can each be a distributed computing environment encompassing multiple computing devices, can be located within their corresponding server, or can be located at the same or at geographically disparate physical locations.

Network 230 can be a local area network (LAN) or a wide area network (WAN), but can also be other wired or wireless networks. In some implementations, network 230 is the Internet or some other public or private network. Client computing devices 205 are connected to network 230 through a network interface, such as by wired or wireless communication. While the connections between server 210 and servers 220 are shown as separate connections, these connections can be any kind of local, wide area, wired, or wireless network, including network 230 or a separate public or private network.

Figure 3:
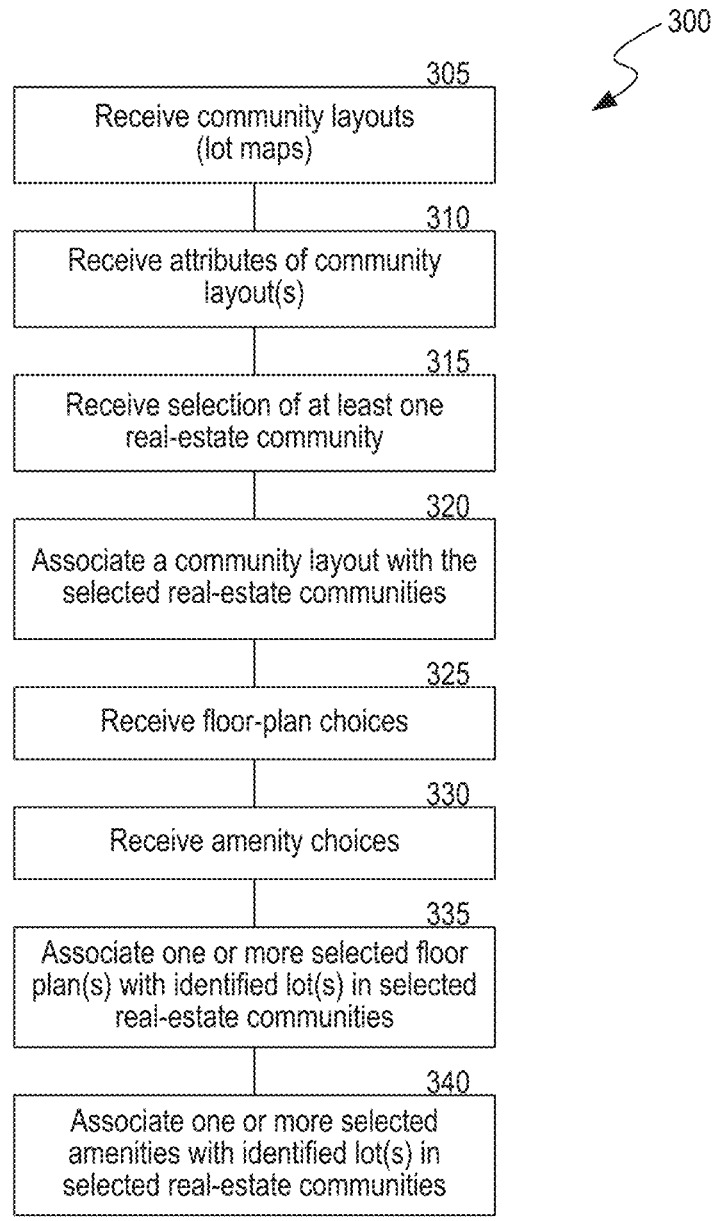
FIG. 3 is a flow diagram illustrating a process used in some embodiments for uploading lot plans, floor-plans, and amenities information for an uncompleted homes community.

FIG. 3 is a flow diagram illustrating a process used in some embodiments for uploading, by a user associated with the builder or developer of a community, an uncompleted homes community to register that community with the facility. Process 300 begins at block 305, where the facility receives information related to one or more community layouts, also called lot maps. Lot maps represent maps of home lots and/or plats/parcels of land. In various embodiments, the facility receives graphic images of lot maps via a user upload, created by a user or a system, or automatically selected from a storage location. After receiving (or retrieving) graphic image and/or reference map information, process 300 proceeds to block 310 where the facility receives attributes associated with the received lot maps. The information associated with lot maps may be obtained automatically by the facility. Real-estate lots in a lot plan can be associated with information such as a profile, user profile, company profile, builder profile, lot number, lot name, and lot size. At block 315, the facility receives a selection of at least one real-estate community with which a previously received lot plan is to be associated. For example, a builder uploads multiple lot plans, each representing different configurations of lots. The builder then selects a real-estate community for which it selects one of the uploaded lot plans. The facility receives the selection of the lot plan and the community and creates an association between them. As part of this association, the facility can update and/or add the following lot information: community information (e.g., community identifier, community name, builder, etc.), address, parcel number, latitude coordinates, longitude coordinates, status (e.g., sold, available, under contract, coming soon, etc.), lot premium, marking headline, description, MLS ID, eligible plans, realtor information, photographs, graphic images, and/or additional information. U.S. patent application Ser. No. 15/788,488, which is incorporated herein by reference in its entirety, provides additional details the acts described in blocks 305-320.

After a lot map is associated with a uncompleted homes community, process 300 proceeds to block 325 where the facility receives information about one or more floor-plans for the community. The floor-plans can be uploaded manually or generated by the facility based on information provided to the facility. For example, a builder can upload one or more 2D or 3D floor-plans for a community. A floor-plan is a drawing, generally to scale, showing a view from above, of the relationships between rooms, spaces, traffic patterns, and other physical features at different levels of a home. Dimensions are often drawn between the walls to specify room sizes and wall lengths. A floor-plan can specify both the internal and external characteristics of a home (e.g., location and dimensions of different rooms, elevation, landscaping, etc.). At block 330, the facility receives information about one or more amenities for the community. Amenities can be uploaded individually or as a package (e.g., the gourmet kitchen amenity package includes stainless-steel appliances, upgraded backsplash, and granite countertops). Amenities can be associated with information such as amenity identifier, description, photographs, availability (selected by default, optional, mandatory, etc.), cost, etc.

At block 335, the facility associates one or more floor-plans with one or more lots. The facility can receive information associating floor-plans and lots from a user (e.g., a builder) or the facility can automatically perform such associations (based on, for example, default options, past history/behavior of the builder, etc.). A floor-plan can be associated with multiple lots and vice-versa (a lot can be associated with multiple floor-plans). At block 340, the facility associates one or more amenities with one or more lots. The facility can receive information associating amenities and lots from a user (e.g., a builder) or the facility can automatically perform such associations (based on, for example, default options, past history/behavior of the builder, etc.). An amenity can be associated with multiple lots and vice-versa (a lot can be associated with multiple amenities). Information about lots, floor-plans, amenities, and any associations is stored in a data storage repository (e.g., data memory 170 and/or databases 215 and 225).

Figure 4A:
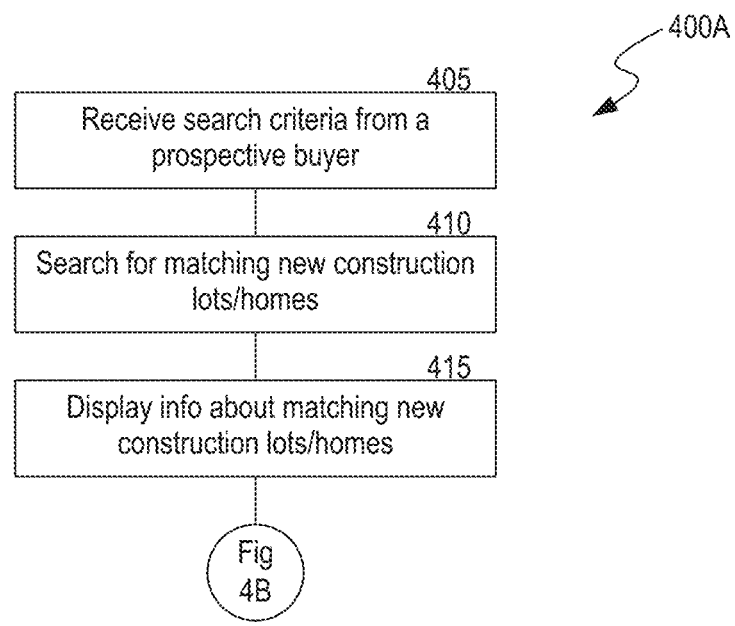
FIG. 4A is a flow diagram illustrating a process performed by the facility in some embodiments to enable a user (e.g., a prospective buyer, a real-estate agent, etc.) to search uncompleted homes.

FIG. 4A is a flow diagram illustrating a process 400A performed by the facility in some embodiments to enable a user (e.g., a prospective buyer, a real-estate agent, etc.) to search uncompleted homes. Process 400A begins at block 405, where the facility receives search criteria for searching uncompleted homes. Search criteria include, but are not limited to location (e.g., zip code, city, state, neighborhood, community, etc.), price, number of bedrooms, number of bathrooms, home type (e.g., houses, apartments, condos, co-ops, townhomes, lots/lands), home size, lot size, year built, availability (e.g., available now, coming soon, under construction, etc.), home owner's association dues, days on the market, keywords, etc. Upon receiving the search criteria from the user, the facility at block 410 searches its data repository for matching uncompleted homes. At block 415, the facility presents the matching uncompleted homes in a user interface.

Figure 6A:
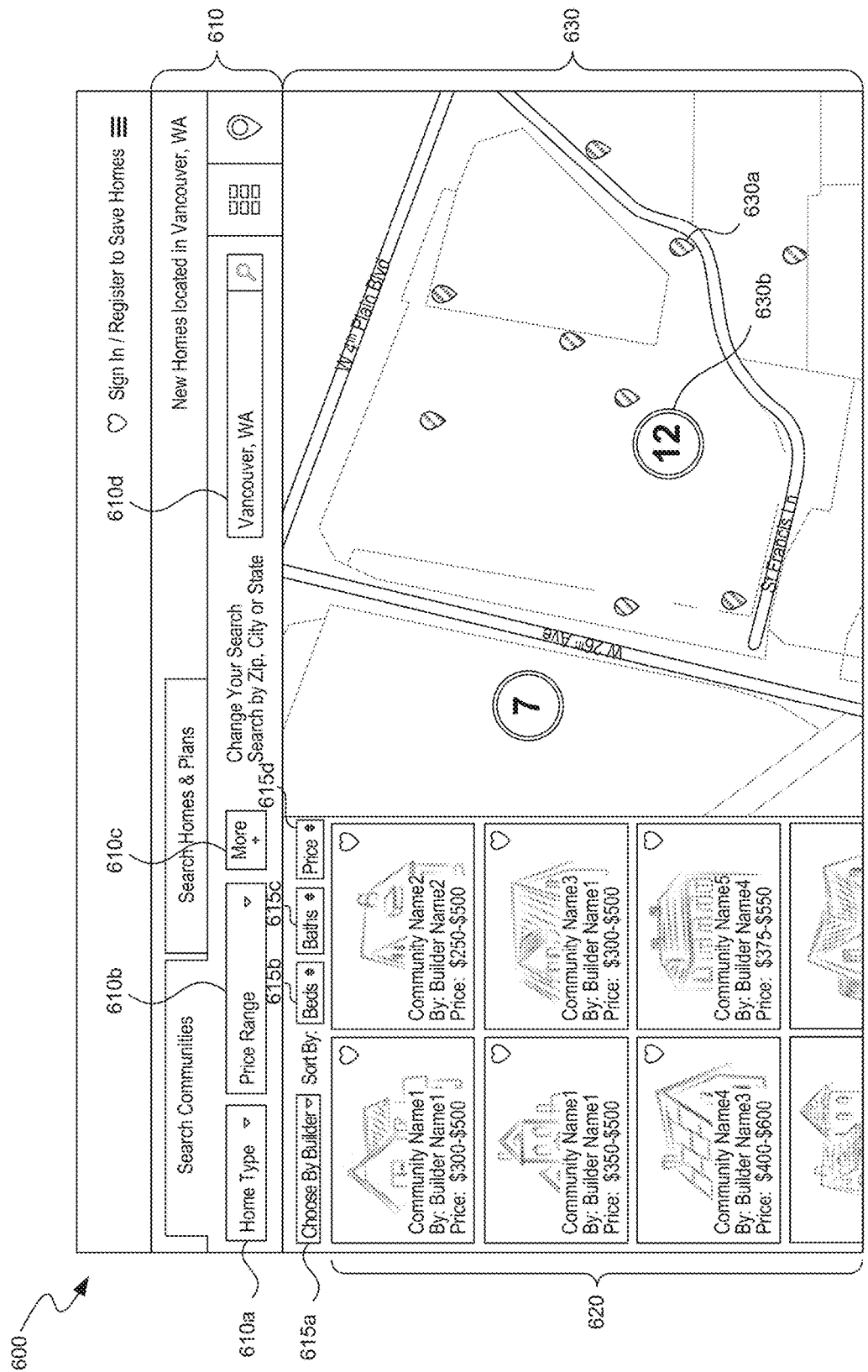
FIG. 6A illustrates a sample user interface for searching for and viewing uncompleted homes.

FIG. 6A illustrates a sample user interface 600 presented by the facility in some embodiments to enable a user to search for and view uncompleted homes (e.g., via a website, a mobile application, etc.). A prospective buyer can specify one or more search criteria 610 such as home type 610a, price range 610b, location 610d, and other filter criteria 610c. Upon receiving the search criteria specified by a user using controls 610a-610d, the facility displays matching uncompleted homes on a map 630 and/or in a table 620. Table 620 includes a graphical representation of each matching home/community. The map portion 630 displays location markers/pins for each matching uncompleted home or development community (e.g., 630a). Development communities can be associated with the same or different developers/builders. Users can filter the matching uncompleted homes based on the builder/developer using control 615a. Users can also sort the results based on one or more criteria such as number of bedrooms 615b, number of bathrooms 615c, and price 615d.

Figure 6B:
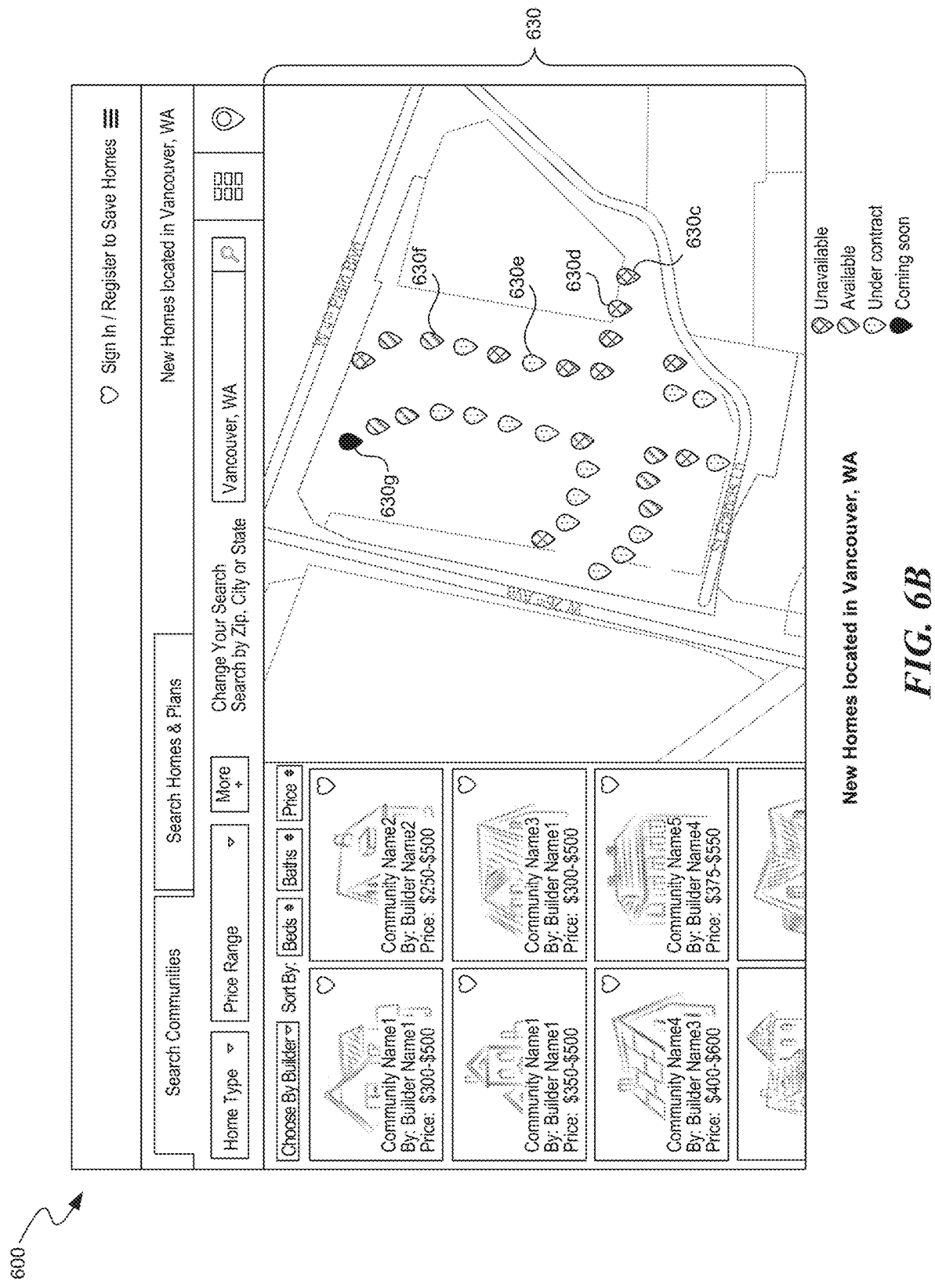
FIG. 6B illustrates a sample user interface for searching for and viewing uncompleted homes.

In some embodiments, the map 630 displays a number 630b corresponding to the number of matching uncompleted home found in a particular area. User interface 600 enables users to move the view to other development communities. Users zoom in or out of the map 630 to view matching homes in a particular geographic location. For example, FIG. 6B illustrates a sample user interface 600 when a user zooms in on the map portion 630 of the figure. In some embodiments, the map portion 630 visually indicates the availability of matching uncompleted homes. For example, pins 630c and 630d are color coded to indicate that the matching home sites/lots are unavailable; pin 630e is color coded to indicate that the matching lot is under contract; pin 630f is color coded to indicate that the matching lot is available, and pic 630g is color coded to indicate that it will soon be available ("coming soon").

Figure 4B:
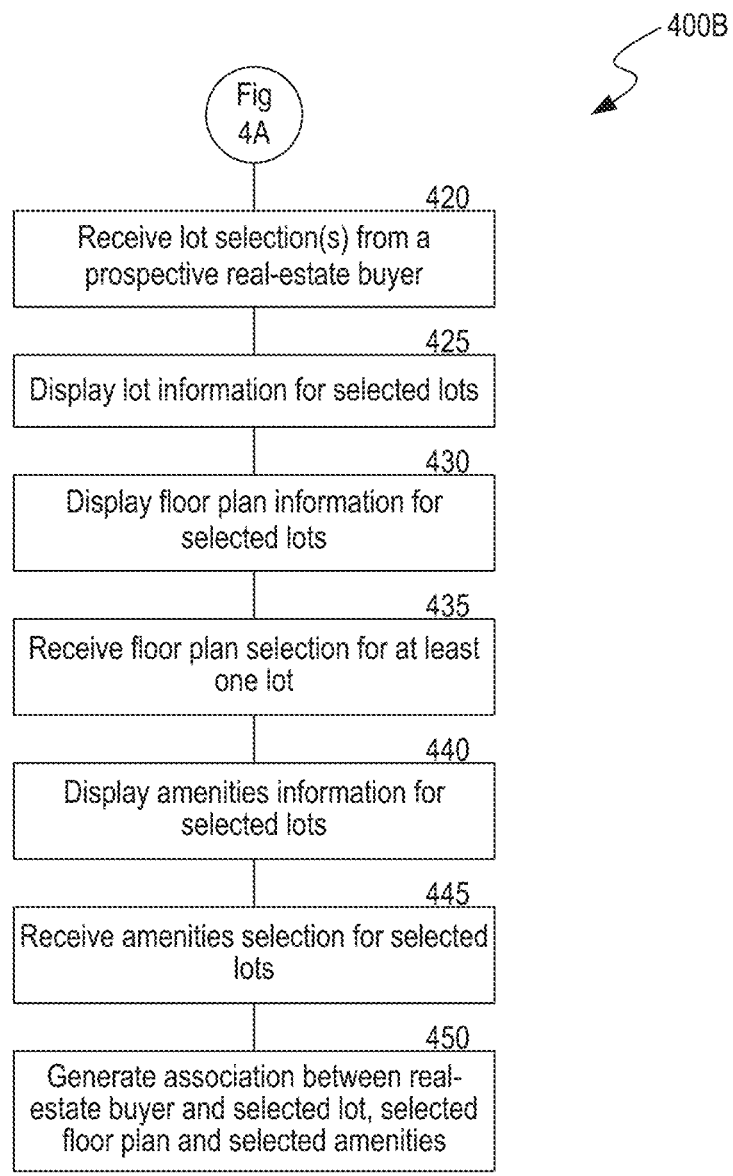
FIG. 4B is a flow diagram illustrating a process performed by the facility in some embodiments to enable a user to access information about lot plans, floor-plans, and amenities information for a uncompleted homes community.

FIG. 4B is a flow diagram illustrating a process 400B performed by the facility in some embodiments to enable a user to access information about lot plans, floor-plans, and amenities information for a uncompleted homes community. Process 400B begins at block 420, where the facility receives lot and/or community selections from a user. For example, users select one or more lots and/or communities by either clicking the graphical representation 620 or the pins (e.g., 630a, 630f, etc.) associated with the respective lot/community. Upon receiving this selection, the facility at block 425 displays information about the selected lots and/or communities.

Figure 7:
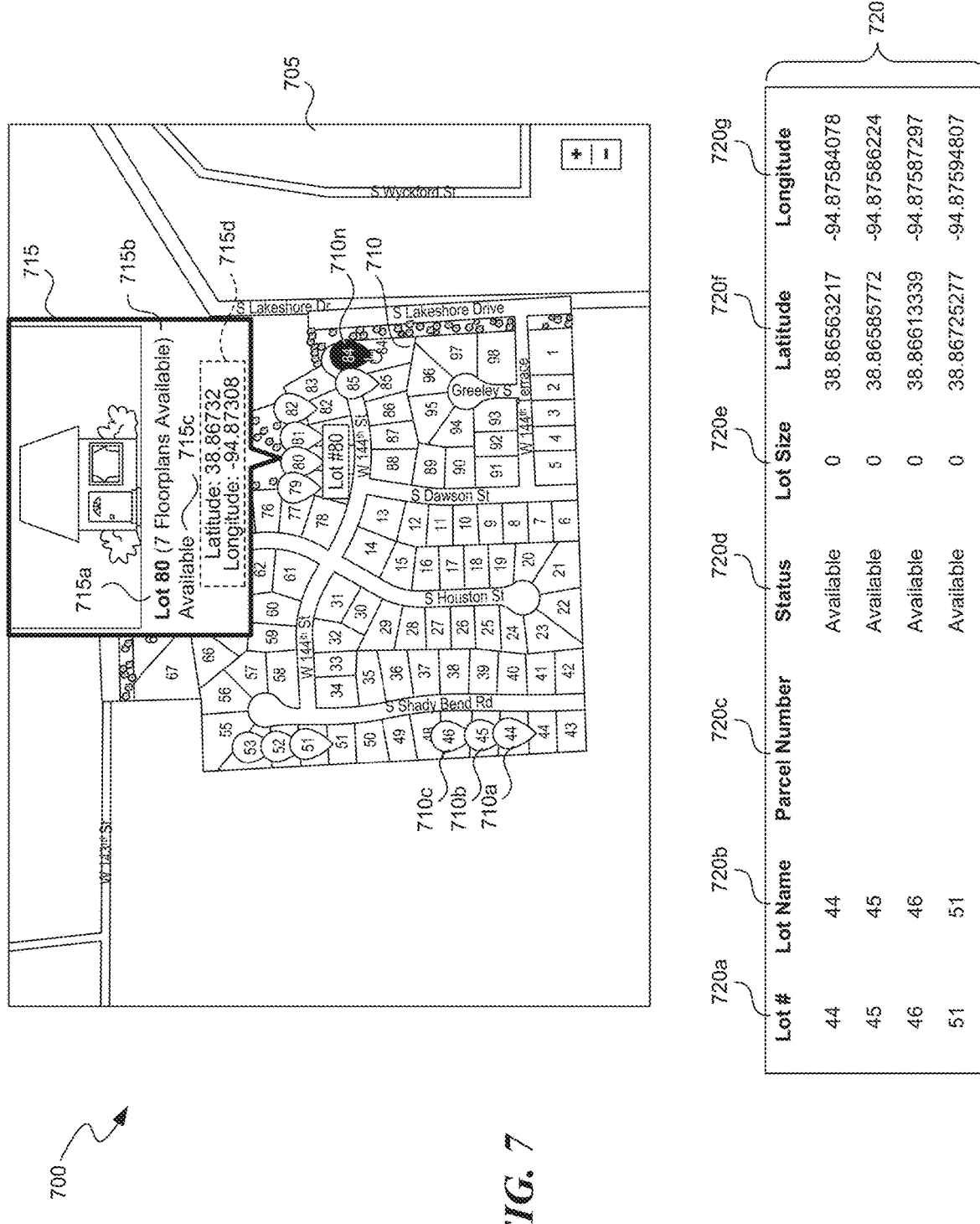
FIG. 7 illustrates a sample user interface for viewing uncompleted homes in a selected community.

FIG. 7 illustrates a sample user interface 700 for viewing information about selected uncompleted lots and/or uncompleted lots in a selected community. For example, when a user selects a given lot or a community, the facility displays an interface 700 that zooms in to that community. The interface 700 includes a community region 705 subdivided into lots as indicated by pins or location markers 710*a*, 710*b*, 710*c*, . . . 710*n*. In some embodiments, a pin does not have an address and the property represented by the pin does not individually exist; the lot for that property is merely planned. In some cases, there may not be a road to access each lot. A user can select a location marker located on the view 710 and view lot information 715. A user can select a location marker to view a control that displays lot information 715. Lot information control displays one or more information elements such as lot number 715*a*, available plans 715*b*, lot size, status 715*c*, and coordinates (longitude and latitude) 715*d*. One or more location markers can be selected to view multiple sets of lot information either singularly or in aggregate (e.g., in control 720). For example, a user views the following information elements for one or more location markers: lot number 720*a*, lot name 720*b*, parcel number 720*c*, status 720*d*, lot size 720*d*, latitude 720*f*, and longitude 720*g*. In some embodiments only a subset of the information elements are displayed when one or more location markers are selected. For example, when control 720 displays several information elements, control 715 displays only a subset of information elements for a selected location marker.

Figure 8:
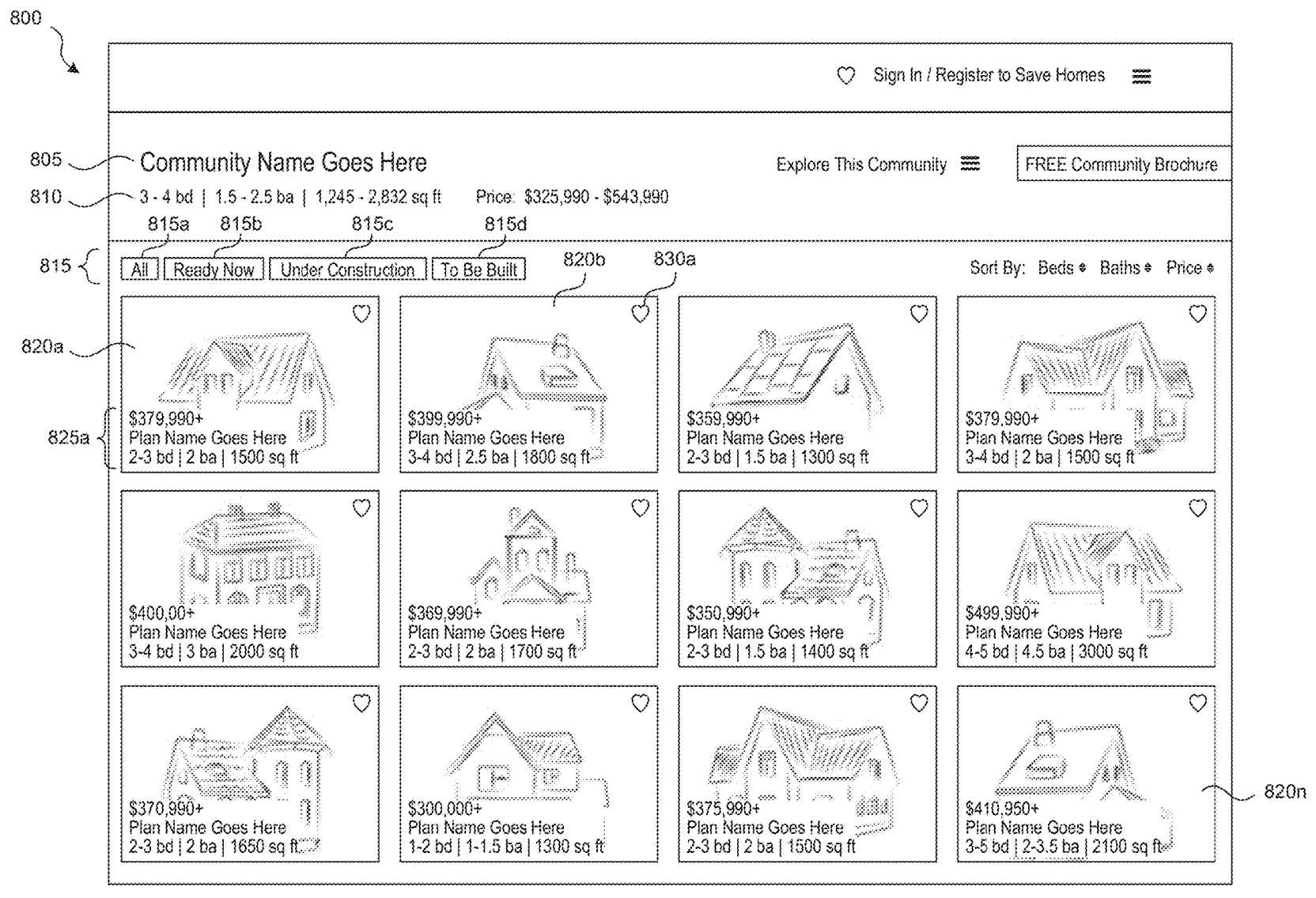

Process 400B then proceeds to block 430 where the facility displays floor-plan information for the selected lots. FIG. 8 illustrates a sample user interface 800 for viewing available floor-plans and amenities for selected uncompleted home lots. The facility filters the floor-plans from a plurality of floor-plans based on the selected lot and/or the builder. For example, the facility only selects the floor-plans previously associated with a certain lot by the builder (e.g., floor-plan 1, floor-plan 2, and floor-plan 8); it ignores the other floor-plans (e.g., floor-plan 3, floor-plan 4, floor-plan 5, floor-plan 6, floor-plan 7, floor-plan 9, . . . floor-plan n). User interface 800 displays information about the community in which the selected lots are located (e.g., community name 805, community features 810, etc.). In some embodiments, user interface 800 displays the filter criteria specified by the user when searching for the selected lot. User interface 800 displays filtered floor-plans 820*a*, 820*b*, . . . , 820*n* and information about each floor-plan 825*a* (e.g., a thumbnail image, floor-plan name, number of bedrooms, number of bathrooms, home size, lot size, etc.). In practice, some lots may have different floor-plans available than others. Users can further filter the displayed floor-plans based on their availability 815 (e.g., All 815*a*, Ready Now 815*b*, Under Construction 815*c*, To Be Built 815*d*, etc.). In developments where houses have not been constructed yet, buyers are able to pick both lots and the house that is built upon that lot. The displayed interface allows homebuyers to cycle through options efficiently. In some embodiments, users mark one or more floor-plans as favorites using control 830*a*. Floor-plans marked as favorites are added to a favorites list for that user (discussed in more detail below with reference to FIG. 10).

Figure 9:
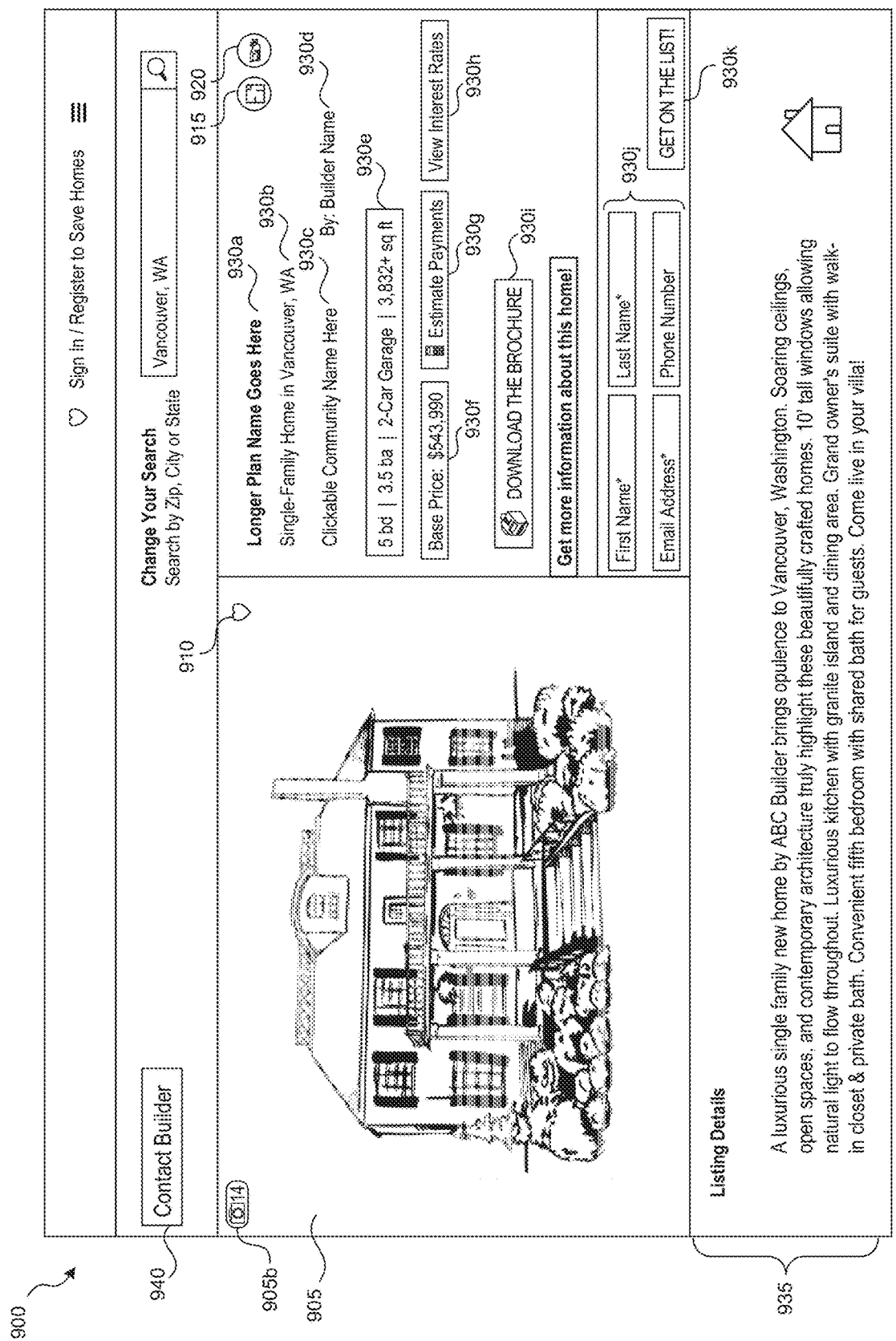
FIG. 9 illustrates a sample user interface for details about a selected floor-plan.

Users can view additional details about a floor-plan by selecting it from the user interface 800. For example, a user clicks the thumbnail image for a floor-plan to view additional information about the selected floor-plan. FIG. 9 illustrates a sample user interface 900 presented by the facility in some embodiments of a floor-plan view for a selected floor-plan. The floor-plan view includes further details regarding the selected floor-plan (e.g., additional images 905*b*, thumbnail view 905, name 930*a*, brief description 930*b*, community name 930*c*, builder name 930*d*, salient features 930*e* (e.g., number of bedrooms, number of bathrooms, number of garages, size, etc.), base price 930*f*, and other listing details 935). The user can also view the layout using control 915 as well as view a video using control 920 (e.g., of a 2D or 3D model video, video of a model home corresponding to the selected floor-plan, etc.) of the floor-plan. To compute estimated payments for the selected lot/floor-plan, the user selects control 930*g*. The facility enables the user to view interest rates (control 930*h*) and download a brochure for the selected floor-plan (control 930*i*). User interface 900 additionally provides controls (930*j* and 930*k*) for a user to join a waiting list or put an offer for the selected lot using the selected floor-plan and/or contact the builder/developer 940.

Process 400B then proceeds to block 435 where the facility receives a selection of a floor-plan for a selected lot. For example, the user selects lot 630*e* (FIG. 6) and then selects floor-plan 820*a* (FIG. 8) as a prospective floor-plan for the selected lot 630*e*. At block 440, the facility displays amenities information for the selected lot/floor-plan. The facility filters the amenities from a plurality of amenities based on the selected lot and/or the selected floor-plan. For example, the facility only selects the amenities previously associated with a certain lot/floor-plan by the builder (e.g., amenity 1, amenity 2, and amenity 6); it ignores the other amenities (e.g., amenity 3, amenity 4, amenity 5, amenity 7, amenity 8, amenity 9, . . . floor-plan n). The facility selects some amenities by default based on the community of the lot (e.g., clubhouse, walking trails, pool, etc.). Other amenities are selected based on the particular lot and/or floor-plan selected by the user. For example, the amenity of a patio may not be available for certain lots (because their terrain does not permit construction of a patio), or the amenity of an extra bathroom may not be available for certain floor-plans. In some embodiments, amenities are grouped as into one or more amenity packages (e.g., the gourmet kitchen amenity package includes stainless-steel appliances, upgraded backsplash, and granite countertops). In some embodiments, the floorplan view (FIG. 9) enables the user to activate interface controls that select amenities. At block 445, the facility receives selections of amenities for a selected floor-plan and lot. At block 450, the facility generates associations between the user, the selected lot, the selected floor-plan, and the selected amenities. For example, a selected lot can be associated with one or more floor-plans and one or more amenities. The facility stores these associations in a data storage repository (e.g., data memory 170 and/or databases 215 and 225).

Figure 10:
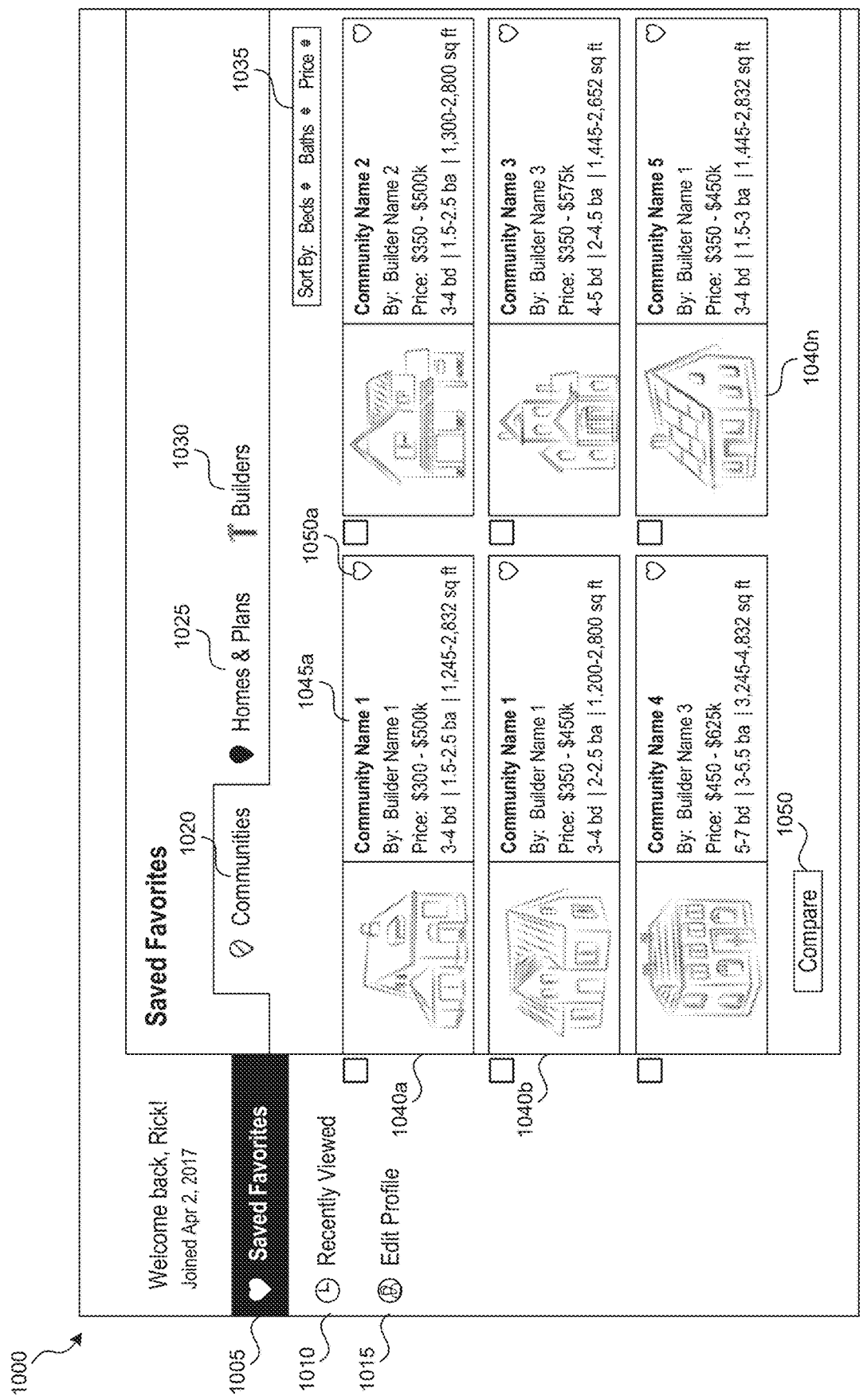
FIG. 10 illustrates a sample user interface presented by the facility in some embodiments to enable a user to view favorite communities, lots, and/or floor-plans.

FIG. 10 illustrates a sample user interface 1000 presented by the facility in some embodiments to enable a user to view favorite communities, lots, and/or floor-plans. User interface 1000 enables users to select particular communities, plans, or builders as favorites. This makes it easier for users to begin and end their home buying experience at different periods of time. The favorites list enables users to highlight particular elements of their home buying experience that they liked to make them easy to revisit later. Users can view favorites by communities 1020, homes and plans 1025, and builders 1030. For example, the communities view 1020 displays the communities 1040*a*, 1040*b*, . . . , 1040*n* that were previously marked as favorites by the user. The facility displays a subset of information about the community 1045*a* such as a thumbnail image, community name, builder name, price range, and key features (e.g., number of bedrooms, number of bathrooms, size, year built, estimated value, time on market, etc.). The user can change the favorites selection using control 1050*a* (e.g., clicking on the control 1050*a* can deselect a community as a favorite and remove it from the user interface 1000). User interface 1000 enables the user to sort the displayed favorites using one or more attributes 1035 such as number of bedrooms, number of bathrooms, price, etc. In addition to favorites, user interface 1000 includes a recently viewed section 1010 to include communities, plans, or builders that the homebuyer may have seen recently but did not favorite. User interface 1000 can further include an edit profile section 1015 that enables the user to edit one or more user profile attributes (e.g., name, profile picture, contact information, preferences, etc.).

In several embodiments, the facility provides a compare feature that allows a user to compare two or more selected communities, lots (with associated floor-plans and/or amenities), homes, or any combination thereof. For example, the user can select two or more favorite communities and then select control 1050 to compare the selected communities. In some embodiments, the user can select for comparison one or more uncompleted homes (e.g., a lot with an associated floor-plan and amenities) and an existing home (e.g., an already built home) for comparison. FIG. 12 illustrates a sample user interface 1200 presented by the facility in some embodiments to enable a user to compare two or more homes/communities. The selected communities are displayed as rows 1205*a*, 1205*b*, 1205*c*, and so on. For each selected community, user interface 1200 displays a thumbnail image (and/or a 2D or 3D model, video thumbnail, etc.) 1210*a*, 1210*b*, and 1210*c*, summary information (e.g., community name, builder/developer name, location, days on market, etc.) 1215*a*, 1215*b*, and 1215*c*, and a control to change the favorites selection 1220*a*, 1220*b*, and 1220*c*. The facility displays one or more attributes for comparing the selected communities as columns—for example, price 1225, number of bedrooms 1230, number of bathrooms 1235, home size 1240, lot size 1245, summary score (e.g., walkability score) 1250, and school ratings 1255. Users can change the attributes compared (i.e., change the columns) by selecting control 1265 to add or delete attributes for comparison. In addition to the above attributes, attributes for comparing communities include but are not limited to listing status, testimonials, amenities, services, utilities, maintenance fees, home owners association fees, washer/dryer, upgrade features, outdoor space, fireplace, gymnasium, community center, pools, doorman, parking, pets allowed, etc. Users can also change the communities to compare (i.e., change the rows) by selecting control 1270 to add or delete communities for comparison. User interface 1200 further enables the user to sort the comparison results based on one or more attributes 1260 such as number of bedrooms, number of bathrooms, prices, etc. In some embodiments, in addition to comparing uncompleted and/or favorite homes with each other, the facility enables the user to compare the uncompleted and/or favorite homes with existing (and/or already built) homes. For example, the facility enables the user to compare a uncompleted home (pre-construction) with a recently sold home in the same neighborhood. This enables the user to perform a comparables analysis with not just the uncompleted homes but also with older construction homes, thus increasing user confidence in a home purchase.

Figure 5:
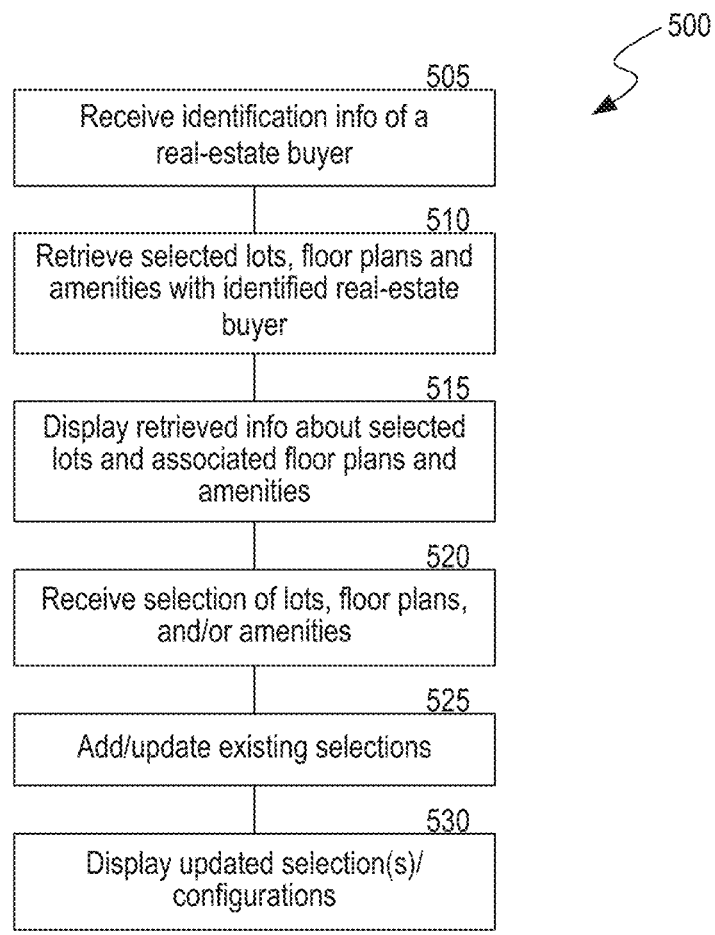
FIG. 5 is a flow diagram illustrating a process performed by the facility in some embodiments to enable a user to update information about selected lot plans, floor-plans, and amenities information.

FIG. 5 is a flow diagram illustrating a process 500 performed by the facility in some embodiments to enable a user to update information about selected lot plans, floor-plans, and amenities information. Process 500 begins at block 505 where the facility receives identification information from a user (e.g., a prospective buyer, a real-estate agent, etc.). Identification information can include but is not limited to user id, password, security code, biometrics, token, or any combination thereof. Upon receiving this identification information, at block 510 the facility retrieves one or more lots, floor-plans, and or amenities that were previously selected by the user. For example, the facility retrieves the favorite communities, lots, floor-plans, and/or amenities previously selected (and/or saved) by the user. At block 515 the facility displays the retrieved information about the previously selected communities, lots, floor-plans, and/or amenities. In some embodiments, the facility from the user for any missing information. For example, if the user previously selected a lot but did not select a floor-plan to associate with the lot, the facility displays the filtered floor-plans for the selected lot and prompts the user for a selection. When a user has finalized a lot, floor-plan, and/or amenities association, the facility further displays a current status of the selections (e.g., selection-in-progress, contract pending, under contract, construction underway, etc.) as well as an expected date until when the current status is valid. For example, for a uncompleted home that is under construction, the facility displays an expected date of completion of the entire construction project or an expected date of completion of a particular construction stage (e.g., grading and site preparation, foundation construction, framing, installation of windows and doors, roofing, siding, rough electrical, rough plumbing, rough HVAC, insulation, drywall, underlayment, trim, painting, finish electrical, bathroom and kitchen counters and cabinets, finish plumbing, carpet and flooring, finish HVAC, hookup to water main, or well drilling, hookup to sewer or installation of a septic system, and punch list). This improves the user experience because the facility provides the user visibility into the most up-to-date status of their home construction project.

At block 520 the facility receives information about any additions and/or modifications to the selections of lots, floor-plans, and/or amenities that a user wishes to make. In some embodiments, the facility determines the current status of the selections to identify modifications that are available to the user. For example, when the status of the selections is in-progress, the facility permits the user to modify the selection of lot, floor-plan, and amenities. When the status of the selections is "under contract," the facility does not allow the user to modify the lot selection; but may allow the user to modify the floor-plan and/or amenities selection. When the status of the selections is "under construction" and the construction stage is beyond "framing," the facility does not allow the user to modify both the lot selection and the floor-plan selection; but the facility allows the user to modify certain amenities (e.g., the user can modify the flooring choice (e.g., carpet v. hardwood) in a room if the "carpet and flooring" construction stage is at least 80 days away) but cannot modify the home elevation choice (e.g., bricks v. stucco)). At block 525 the facility updates the selection choices modified by the user and displays the updated selections at a user interface (block 530). This process may repeat when the user makes subsequent additions and/or updates to the lot, floor-plan, and/or amenities selection.

Figure 11:
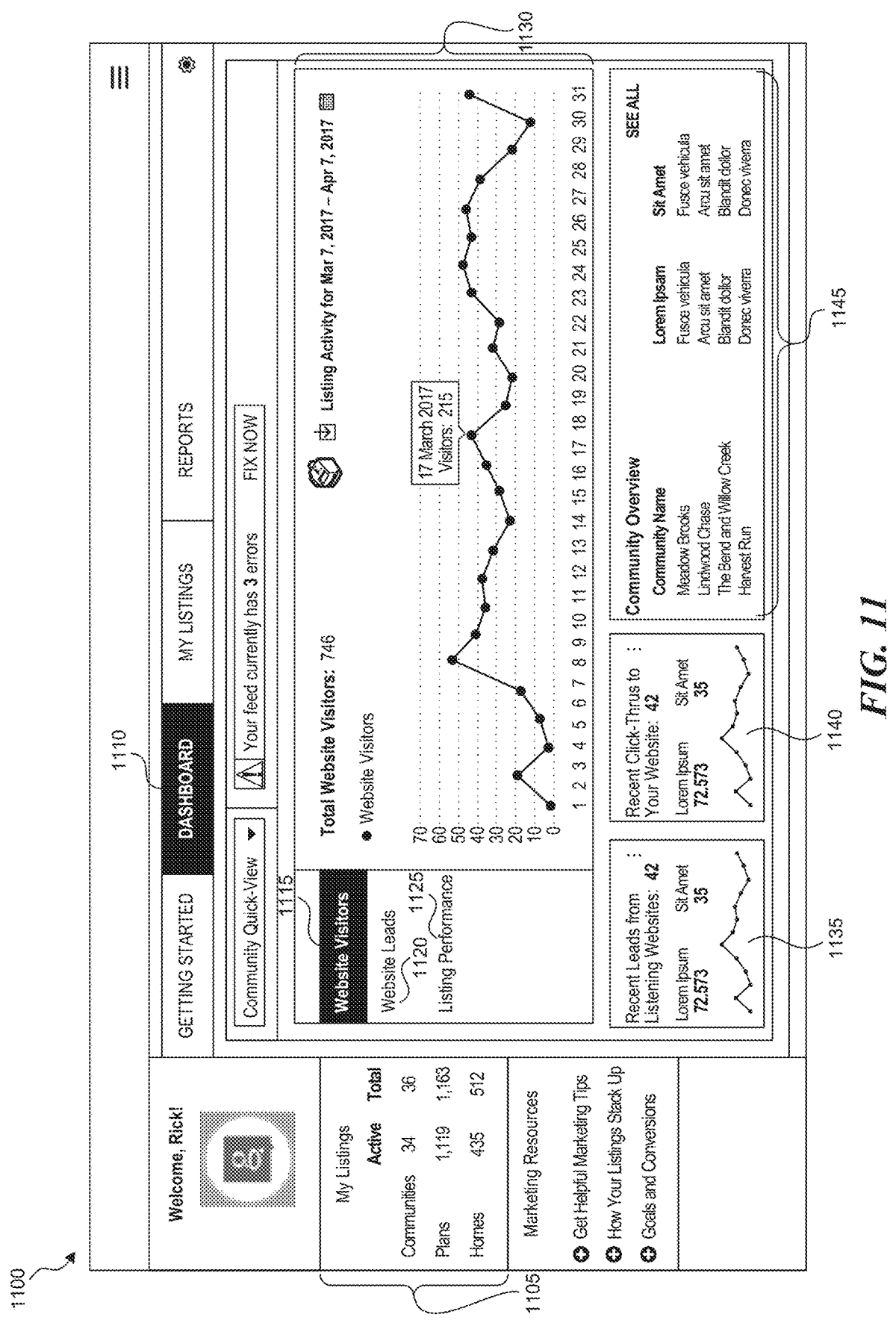

In some embodiments, the facility enables a builder to view statistics associated with one or more uncompleted homes communities associated with the builder. FIG. 11 illustrates a sample user interface 1100 presented by the facility in some embodiments to enable a user to view statistics of uncompleted homes communities. User interface 1100 is a type of dashboard for a builder and it enables a builder to review the statistics on their active development communities. A builder can use this interface to tailor their listings for maximum visibility. User interface 1100 displays a summary of the builder's listings 1105 (e.g., active and/or total communities, plans, and homes) and a graphical view of different statistics 1130. For example, user interface 1100 displays a graph charting total website visitors over time 1115, website leads 1120, listing performance 1125, recent leads from listing websites 1135, recent click-throughs to the builder's website 1140, and an overview of one or more builder communities 1145. User interface 1100 can further display detailed information about the builder's listings and/or reports (canned and/or ad-hoc).

The facility can be implemented using one or more databases. The database may be implemented as any type of non-volatile storage with a store and retrieve interface. The one or more databases may store one or more of user profile information, client profile information, community profile information, company information, lot information, and/or maps.

In some embodiments, permissions, security, and settings can be configured for one or more of user profile information, project, client profile information, community profile information, company information, lot information, and/or maps. The permissions, security and settings may include information users can edit, modify or add to one or more of user profile information, project, client profile information, community profile information, company information, lot information, and/or maps. Multiple projects may be stored associated with the community. The permissions, security and settings may include information users associated with a company profile can edit, modify or add to one or more of user profile information, project, client profile information, community profile information, company information, lot information, and/or maps.

In some embodiments, a user may access the database using a user device. A user device can include a personal device, a mobile device, a tablet, a personal computer, or another device having a hardware processor. The database can be stored on a computer, a server, a mobile device, or another a device having a hardware processor.

In some embodiments, the facility operates with respect to multiple communities. Each community may have community information. Community information may include one or more of listing status, address, general information, graphic images, videos, testimonials, amenities, services, maps, utilities, and/or school information. One or more plan/models may be associated with one or more of communities, users, companies, and/or lots.

In addition to the above mentioned examples, various other modifications and alterations of the invention may be made without departing from the invention. Accordingly, the above disclosure is not to be considered as limiting and the appended claims are to be interpreted as encompassing the true spirit and the entire scope of the invention.

Those skilled in the art will appreciate that the process shown in FIGS. 3, 4A, 4B, and 5 may be altered in a variety of ways. For example, the order of the acts may be rearranged; some acts may be performed in parallel; shown acts may be omitted, or other acts may be included; a shown act may be divided into subacts, or multiple shown acts may be combined into a single act, etc.

It will be appreciated by those skilled in the art that the above-described facility may be straightforwardly adapted or extended in various ways. While the foregoing description makes reference to particular embodiments, the scope of the invention is defined solely by the claims that follow and the elements recited therein.

We claim:

1. A computer-readable storage medium whose contents are capable of causing a computing system to perform a method for associating one or more lots with selected floor-plans and amenities, the method comprising:
   displaying a set of location markers, wherein each location marker uniquely identifies a location of a lot in a real-estate community;
   receiving, from a prospective buyer, a selection of one or more location markers from the set of location markers; and
   for each of at least one selected location marker, including at least one location marker associated with an uncompleted lot:
      displaying information of a set of floor-plans available for the selected location marker, wherein the floor-plans are selected from a plurality of floor-plans based on a current status associated with the selected location marker;
      receiving, from the prospective buyer, a selection of one or more floor-plans from the set of floor-plans for the selected location marker;
      displaying information of a set of amenities available for the selected location marker, wherein the displayed amenities are selected from a filtered plurality of amenities based on the current status associated with the selected location marker and the selected one or more floor-plans;
      receiving, from the prospective buyer, a selection of one or more amenities from the set of amenities for the selected location marker;
      generating an association between the prospective buyer, the selected location marker, the selected floor-plans, and the selected amenities;
      storing the association in a data storage location;
      receiving an update to a floor-plan, one or more amenities or both associated with a first location marker selected from the set of location markers;
      determining a current status of the first location marker;
      based on the current status of the first location marker, determining whether the received update is permitted;
      when the received update is permitted:
         updating a stored association between the prospective buyer, the first location marker and associated floor-plan and amenities in the data storage location; and
      when the received update is not permitted:
         displaying an error message wherein the error message includes information about the current status of the first location marker and a message explaining at least one reason for not permitting the received update.

2. The computer-readable storage medium of claim 1, wherein location markers in the set of location markers are displayed on a map of lots in the real-estate community.

3. The computer-readable storage medium of claim 1, wherein each location marker in the set of location markers is associated with location information comprising at least one of latitude coordinates, longitude coordinates, or elevation coordinates of the location on the combined view.

4. The computer-readable storage medium of claim 1, wherein the method further comprises:

receiving an indication to mark as favorite the association between the prospective buyer, the selected location marker, the selected floor-plans, and the selected amenities;
storing the indication to mark as favorite in the data storage location.

5. The computer-readable storage medium of claim 1, wherein the method further comprises:
receiving identification information of a user;
retrieving at least two stored associations from the data storage location based on the identification information of the user;
displaying information of the retrieved associations at a user interface, wherein each retrieved associations comprises information of one or more of the following: the user, at least one location marker, at least one floor-plan, at least one amenity, or a combination thereof;
receiving, from the user, a selection of at least two displayed associations;
receiving, from the user, a selection to compare the at least two selected associations; and
displaying a comparison table showing the result of comparing one or more attributes of the at least two selected associations,
wherein rows of the comparison table correspond to the at least two selected associations and each column corresponds to each of the one or more compared attributes.

6. The computer-readable storage medium of claim 1, wherein the method further comprises:
displaying a current status of the association between the prospective buyer, the selected location marker, the selected floor-plans, and the selected amenities,
wherein the current status of the association is at least one of the following: selection-in-progress, contract pending, under contract, and construction underway; and
displaying an expected date until when the current status is valid.

7. The computer-readable storage medium of claim 1, wherein the method further comprises:
displaying a current stage of construction, wherein the current stage of construction is one of the following: grading and site preparation, foundation construction, framing, installation of windows and doors, roofing, siding, rough electrical, rough plumbing, rough HVAC, insulation, drywall, underlayment, trim, painting, finish electrical, bathroom and kitchen counters and cabinets, finish plumbing, carpet and flooring, finish HVAC, hookup to water main, or well drilling, hookup to sewer or installation of a septic system, and punch list; and
displaying an expected date of completion of the current stage of construction.

8. A method for associating one or more lots with selected floor-plans and amenities comprising:
displaying a set of location markers identifying a location of a lot in a real-estate community;
receiving, from a prospective buyer, a selection of one or more location markers from the set of location markers;
displaying lot information of the one or more selected location markers, wherein the lot information of each of the one or more selected location markers is displayed in aggregate with the lot information of each other of the one or more selected location markers; and
for each of the one or more selected location markers including at least one location marker associated with an uncompleted lot:
displaying information of a set of floor-plans filtered from a plurality of floor-plans based on the selected location marker;
receiving, from the prospective buyer, a selection of one or more floor-plans from the set of floor-plans for the selected location marker;
displaying information of a set of amenities, wherein the displayed amenities are selected from a filtered plurality of amenities based on a current status associated with the selected location marker and the selected one or more floor plans;
receiving, from the prospective buyer, a selection of one or more amenities from the set of amenities for the selected location marker;
generating an association between the prospective buyer, the selected location marker, the selected floor-plans, and the selected amenities;
storing the association in a data storage location
receiving an update to a floor-plan, one or more amenities, or both associated with a first location marker selected from the set of location markers;
determining a current status of the first location marker;
based on the current status of the first location marker, determining whether the received update is permitted;
when the received update is permitted:
updating a stored association between the prospective buyer the first location marker and associated floor-plan and amenities in the data storage location; and
when the received update is not permitted:
displaying an error message, wherein the error message includes information about the current status of the first location marker and a message explaining at least one reason for not permitting the received update.

9. The method of claim 8, wherein location markers in the set of location markers are displayed on a map of lots in the real-estate community.

10. The method of claim 8, wherein each location marker in the set of location markers is associated with location information comprising at least one of latitude coordinates, longitude coordinates, or elevation coordinates of the location on the combined view.

11. The method of claim 8 further comprising:
receiving an indication to mark as favorite the association between the prospective buyer, the selected location marker, the selected floor-plans, and the selected amenities;
storing the indication to mark as favorite in the data storage location.

12. The method of claim 8 further comprising:
receiving identification information of a user;
retrieving at least two stored associations from the data storage location based on the identification information of the user;
displaying information of the retrieved associations at a user interface, wherein each retrieved associations comprises information of one or more of the following: the user, at least one location marker, at least one floor-plan, at least one amenity, or a combination thereof;
receiving, from the user, a selection of at least two displayed associations;

receiving, from the user, a selection to compare the at least two selected associations; and displaying a comparison table showing the result of comparing one or more attributes of the at least two selected associations,
wherein rows of the comparison table correspond to the at least two selected associations and each column corresponds to each of the one or more compared attributes.

13. The method of claim 8 further comprising:

displaying a current status of the association between the prospective buyer, the selected location marker, the selected floor-plans, and the selected amenities,
wherein the current status of the association is at least one of the following: selection-in-progress, contract pending, under contract, and construction underway; and displaying an expected date until when the current status is valid.

14. The method of claim 8 further comprising:

displaying a current stage of construction, wherein the current stage of construction is one of the following: grading and site preparation, foundation construction, framing, installation of windows and doors, roofing, siding, rough electrical, rough plumbing, rough HVAC, insulation, drywall, underlayment, trim, painting, finish electrical, bathroom and kitchen counters and cabinets, finish plumbing, carpet and flooring, finish HVAC, hookup to water main, or well drilling, hookup to sewer or installation of a septic system, and punch list; and displaying an expected date of completion of the current stage of construction.

15. A computer-readable medium comprising instructions that, when executed by one or more processors, cause the one or more processors to perform a process, the process comprising:

displaying a set of location markers identifying a location of a lot in a real-estate community;

receiving, from a prospective buyer, a selection of one or more location markers from the set of location markers;

for each of the one or more selected location markers:
receiving, from the prospective buyer, a selection of one or more floor-plans for the selected location marker;
receiving, from the prospective buyer, a selection of one or more amenities for the selected location marker;
generating an association between the prospective buyer, the selected location marker, the selected one or more floor-plans, and the selected one or more amenities;
storing the association in a data storage location
receiving an update to a floor-plan, one or more amenities, or both associated with a first location marker selected from the set of location markers;
determining a current status of the first location marker;
based on the current status of the first location marker, determining whether the received update is permitted;
when the received update is permitted:
updating a stored association between the prospective buyer, the first location marker and associated floor-plan and amenities in the data storage location; and
when the received update is not permitted:
displaying an error message, wherein the error message includes information about the current status of the first location marker and a message explaining at least one reason for not permitting the received update.

16. The computer-readable medium of claim 15, the process further comprising:

displaying the current status of the association between the prospective buyer, the selected location marker, the selected one or more floor-plans, and the selected one or more amenities,
wherein the current status of the association is at least one of the following: selection-in-progress, contract pending, under contract, and construction underway; and displaying an expected date until when the current status is valid.

17. The computer-readable medium of claim 15, the process further comprising:

receiving an indication to mark as favorite the association between the prospective buyer, the selected location marker, the selected one or more floor-plans, and the selected one or more amenities; and storing the indication to mark as favorite in the data storage location.

18. The computer-readable medium of claim 15, the process further comprising:

displaying a current stage of construction, wherein the current stage of construction is one of the following: grading and site preparation, foundation construction, framing, installation of windows and doors, roofing, siding, rough electrical, rough plumbing, rough HVAC, insulation, drywall, underlayment, trim, painting, finish electrical, bathroom and kitchen counters and cabinets, finish plumbing, carpet and flooring, finish HVAC, hookup to water main, or well drilling, hookup to sewer or installation of a septic system, and punch list; and displaying an expected date of completion of the current stage of construction.

19. The computer-readable medium of claim 15, the process further comprising:

displaying, at a user interface, each of the one or more floor-plans, the one or more amenities, or any combination thereof available at each location marker of the set of location markers, wherein the prospective buyer selects the one or more floor-plans, the one or more amenities, or any combination thereof using the user interface.

20. The computer-readable medium of claim 15, the process further comprising:

retrieving at least two stored associations from the data storage location, wherein the at least two stored associations are associated with the prospective buyer;

displaying information of the retrieved at least two stored associations at a user interface, wherein each retrieved associations comprises information of one or more of the following: least one location marker, at least one floor-plan, at least one amenity, or a combination thereof;

receiving, from the user, a selection of at least two displayed associations;

receiving, from the user, a selection to compare the at least two selected associations; and displaying a comparison table showing the result of comparing one or more attributes of the at least two selected associations.

* * * * *